(12) United States Patent
Iadanza

(10) Patent No.: US 6,927,590 B2
(45) Date of Patent: Aug. 9, 2005

(54) METHOD AND CIRCUIT FOR TESTING A REGULATED POWER SUPPLY IN AN INTEGRATED CIRCUIT

(75) Inventor: Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 10/604,844

(22) Filed: Aug. 21, 2003

(65) Prior Publication Data

US 2005/0040841 A1 Feb. 24, 2005

(51) Int. Cl.⁷ .............................................. G01R 31/02
(52) U.S. Cl. ....................................................... 324/763
(58) Field of Search ................................. 324/763, 760, 324/158.1; 714/733, 734, 724; 365/174, 182, 201, 226; 323/273–274, 277; 307/112, 125, 130, 134, 139

(56) References Cited

U.S. PATENT DOCUMENTS

| | | | | |
|---|---|---|---|---|
| 4,227,185 A | * | 10/1980 | Kronlage | 324/99 D |
| 4,792,749 A | * | 12/1988 | Kitagawa et al. | 323/317 |
| 5,428,299 A | * | 6/1995 | Koshikawa | 324/763 |
| 5,566,185 A | * | 10/1996 | Hori et al. | 714/724 |
| 5,712,859 A | * | 1/1998 | Hori et al. | 714/724 |
| 5,943,282 A | * | 8/1999 | Iwata et al. | 365/204 |
| 5,955,870 A | * | 9/1999 | Nair | 323/273 |
| 6,081,105 A | * | 6/2000 | Nair | 323/273 |
| 6,084,385 A | * | 7/2000 | Nair | 323/273 |
| 6,504,394 B2 | * | 1/2003 | Ohlhoff | 324/763 |
| 6,833,281 B2 | * | 12/2004 | Gilliam | 324/765 |

* cited by examiner

Primary Examiner—Jermele M. Hollington
(74) Attorney, Agent, or Firm—Schmeiser, Olsen & Watts; Richard A. Henkler (57) ABSTRACT

A voltage regulated power supply test circuit including: a voltage regulator electrically connected to at least one regulated voltage node of a functional circuit of an integrated circuit chip; and means for selectively connecting between one of the at least one regulated voltage nodes and ground with at least one load circuit adapted to put an emulated current load of the functional circuit on the regulated voltage supply.

28 Claims, 7 Drawing Sheets

METHOD AND CIRCUIT FOR TESTING A REGULATED POWER SUPPLY IN AN INTEGRATED CIRCUIT

BACKGROUND OF INVENTION

1. Field of the Invention

The present invention relates to the field of testing integrated circuits; more specifically, it relates to a method and circuit for testing regulated power supplies in integrated circuits.

2. Background of the Invention

Modern integrated circuits can include the capability to regulate voltage domains in both analog and digital applications. To date, the testing of the circuits generating regulated voltages in these applications has been limited. In analog applications, the regulated voltage generating circuit is often not directly tested and is considered "good" if the circuits it supplies function. In digital applications, often the voltage at a single point in the power distribution network is measured, but with the logic circuits inactive.

These test methods do not insure that the regulated voltage generating circuit has adequate current margin under operating conditions or, in the case of multiple voltage generating circuits, if one or more are not operating properly.

SUMMARY OF INVENTION

A first aspect of the present invention is a voltage regulated power supply test circuit comprising: a voltage regulator electrically connected to at least one regulated voltage node of a functional circuit of an integrated circuit chip; and means for selectively connecting between one of the at least one regulated voltage nodes and ground with at least one load circuit adapted to put an emulated current load of the functional circuit on the regulated voltage supply.

A second aspect of the present invention is a method of testing a voltage regulated power supply comprising: providing a voltage regulator electrically connected to at least one regulated voltage node of a functional circuit of an integrated circuit chip; and selectively connecting between one of the at least one regulated voltage nodes and ground with at least one load circuit adapted to put an emulated current load of the functional circuit on the regulated voltage supply.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
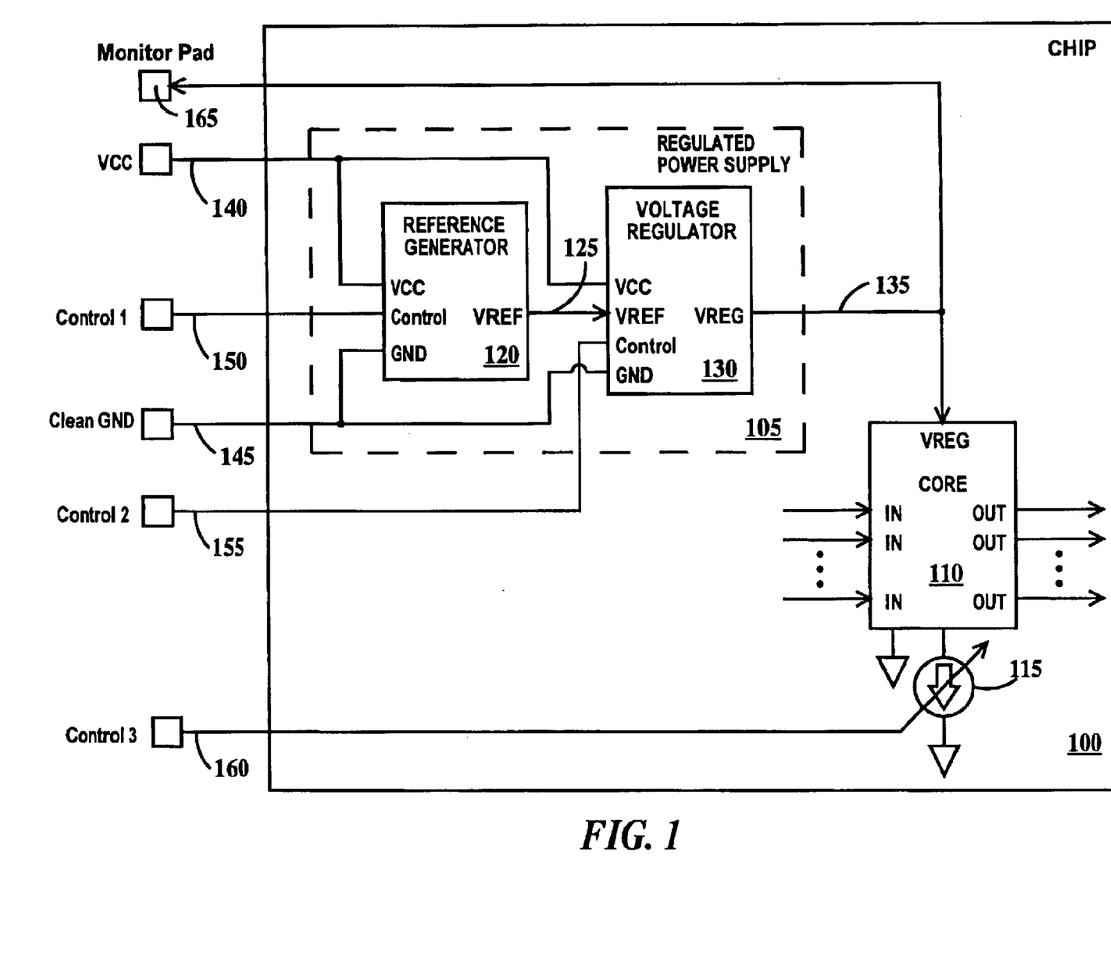
FIG. 1 is a schematic diagram of a first embodiment of the present invention.

FIG. 1 is schematic diagram of a first embodiment of the present invention. In FIG. 1, integrated circuit chip 100 includes a regulated power supply 105, a "core" circuit 110 having a multiplicity of inputs and outputs, and a current sink 115. The purpose of current sink 115 is to emulate current loading on voltage regulator 130 by core 110. Regulated power supply 105 includes a reference generator 120 supplying a reference voltage (VREF) on a reference voltage line 125 to a voltage regulator 130. Voltage regulator 130 supplies a regulated voltage (VREG) on a regulated voltage line 135 to core 110. Current sink 115 is electrically connected between the VREG input in core 110 and ground. Reference generator 120 and voltage regulator 130 are both electrically connected between a VCC source 140 and a clean ground source 145, which in one example, are supplied from off-chip. The mode (see infra) of reference generator 120 is controlled by a first control signal 150, the mode of voltage regulator 130 is controlled by a second control signal 155 and current sink 115 is electrically connected or disconnected from between the VREG input of core 110 and ground by a third control signal 160. Third control signal 160 may also be used to vary the amount of current sinking. Current sink 115 is illustrated as a variable current sink, capable of sinking different amounts of current in response to third control signal 160, however, a current sink that sinks a fixed amount of current may be used. In a first example, first control signal 150, second control signal 155 and third control signal 160 are supplied from an off-chip tester and the first and second control signals are the same signal. In a second example, first control signal 150, second control signal 155 and third control signal 160 are supplied from a built-in self-test (BIST) circuit and the first and second control signals are the same signal. A monitor pad 165 may be electrically tapped into VREF along reference voltage line 135 in order to monitor the magnitude of the regulated voltage during testing of regulated power supply 105. Physically the tap may be at the output of voltage regulator 130 or the input of core 110.

VREF, supplied by reference generator 120, is a very precise voltage in that the reference generator is insensitive to temperature, input voltage fluctuations and semiconductor process variations such as doping levels and linewidth that affect transistor parametrics. Voltage regulator 130 is a unity gain buffer that replicates the voltage value of VREF in VREG. Reference generator 120 generally cannot provide a large amount of current, however voltage regulator 130 can provide a large amount of current. In applications where precise control of voltage levels is not required, reference generator 120 may be omitted. Examples of VCC voltages include values in the range of about 2.3 to 2.6 volts. Examples of VREG voltages include values in the range of about 1.0 to 1.5 volts.

In normal operational mode, regulated power supply 105 is on, core 110 is in functional mode and current sink 115 is electrically disconnected from between the VREG input of core 110 and ground, however the core itself is always electrically coupled to ground. In test mode, core 110 is placed in a quiescent state in order to simplify clock and input setup/stimulus and to minimize currents native to the operation of the core, reference generator 120 and reference regulator 130 are turned on, current sink 115 is electrically connected between the VREG input of core 110 and ground and the voltage on monitor pad 165 is measured. In the case of a variable current current sink, the load may be varied to check the current guardband of regulated power supply 105 or for yield sorting. Control signal 160 may be provided from any number of well-known tester-driven current reference techniques or by tester control of a reference/current digital to analog converter (DAC) system.

While FIG. 1 is illustrated for a single core, in practice, more than one core may be supplied from the same regulated power supply and there may be multiple instances of regulated power supply/core combinations. Also, the term "voltage-island" may be substituted for the term "core." Although cores and voltage islands are not strictly identical in that generally a voltage-island fences input and output signals (stores the state of the voltage-island prior to shutdown so it can be restored) when it is turned on and off, the present invention is equally applicable to integrated circuit chips containing voltage-islands and for testing regulated power supplies supplying power to voltage islands.

Figure 2:
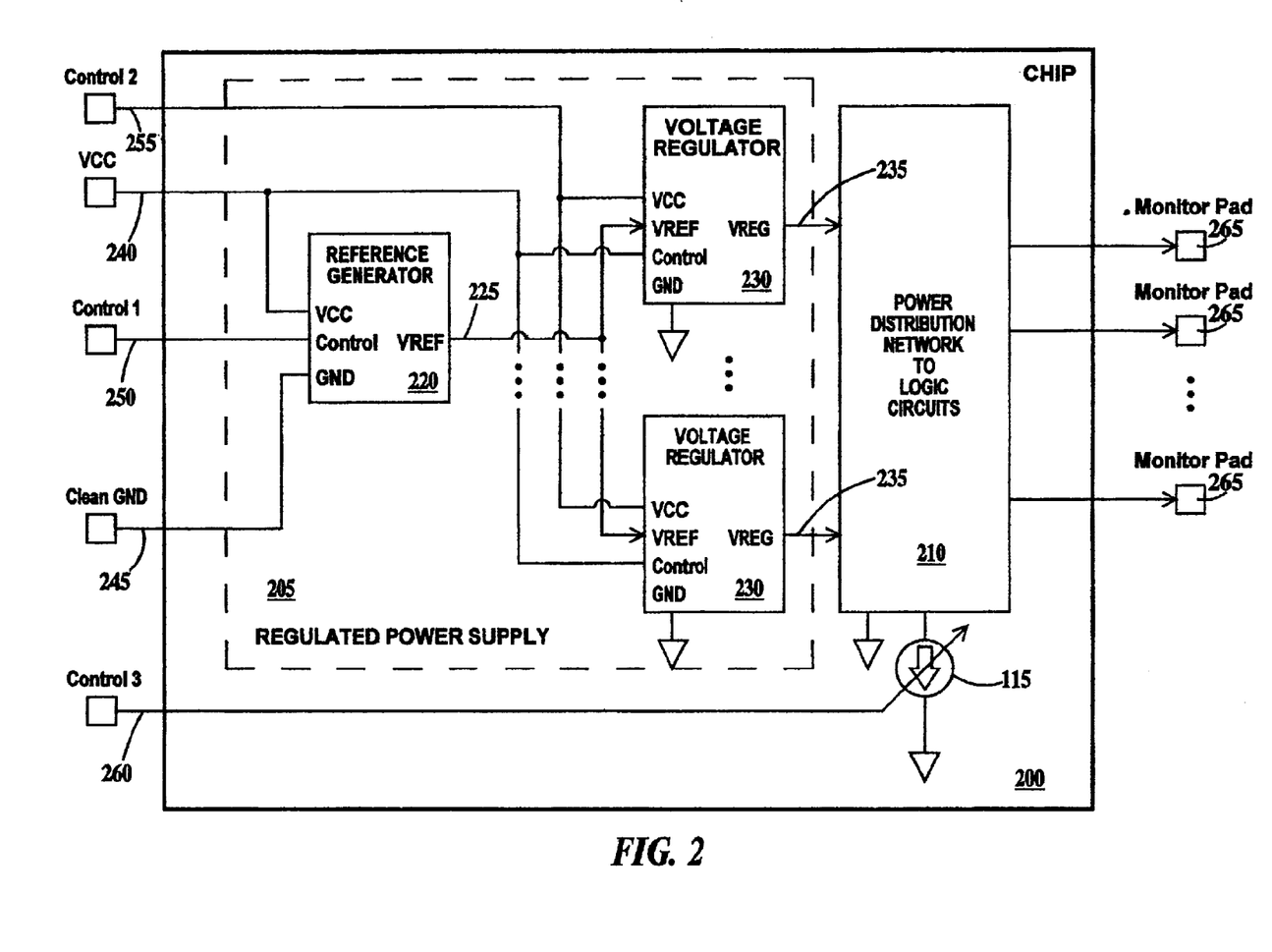
FIG. 2 is a schematic diagram of a second embodiment of the present invention.
Figure 6A:
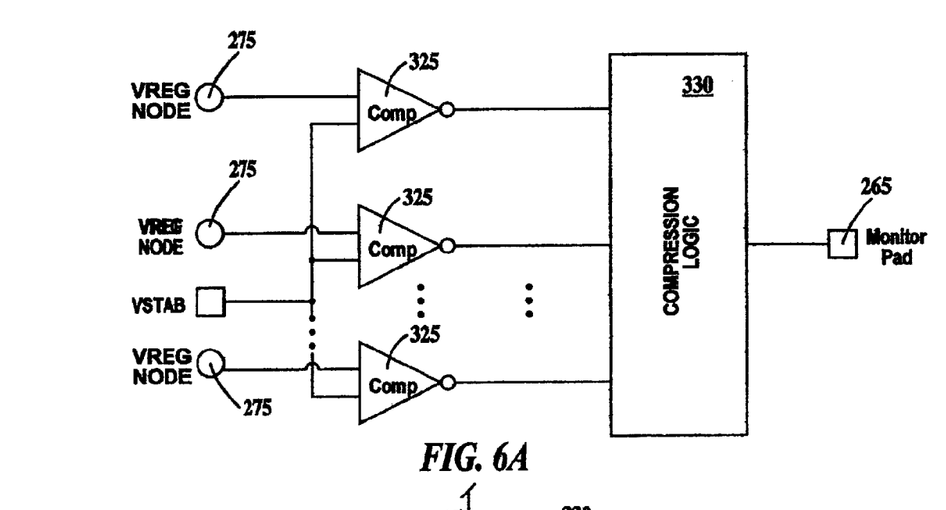
FIG. 6A is a schematic diagram of a first test data output element according to the present invention.
Figure 7:
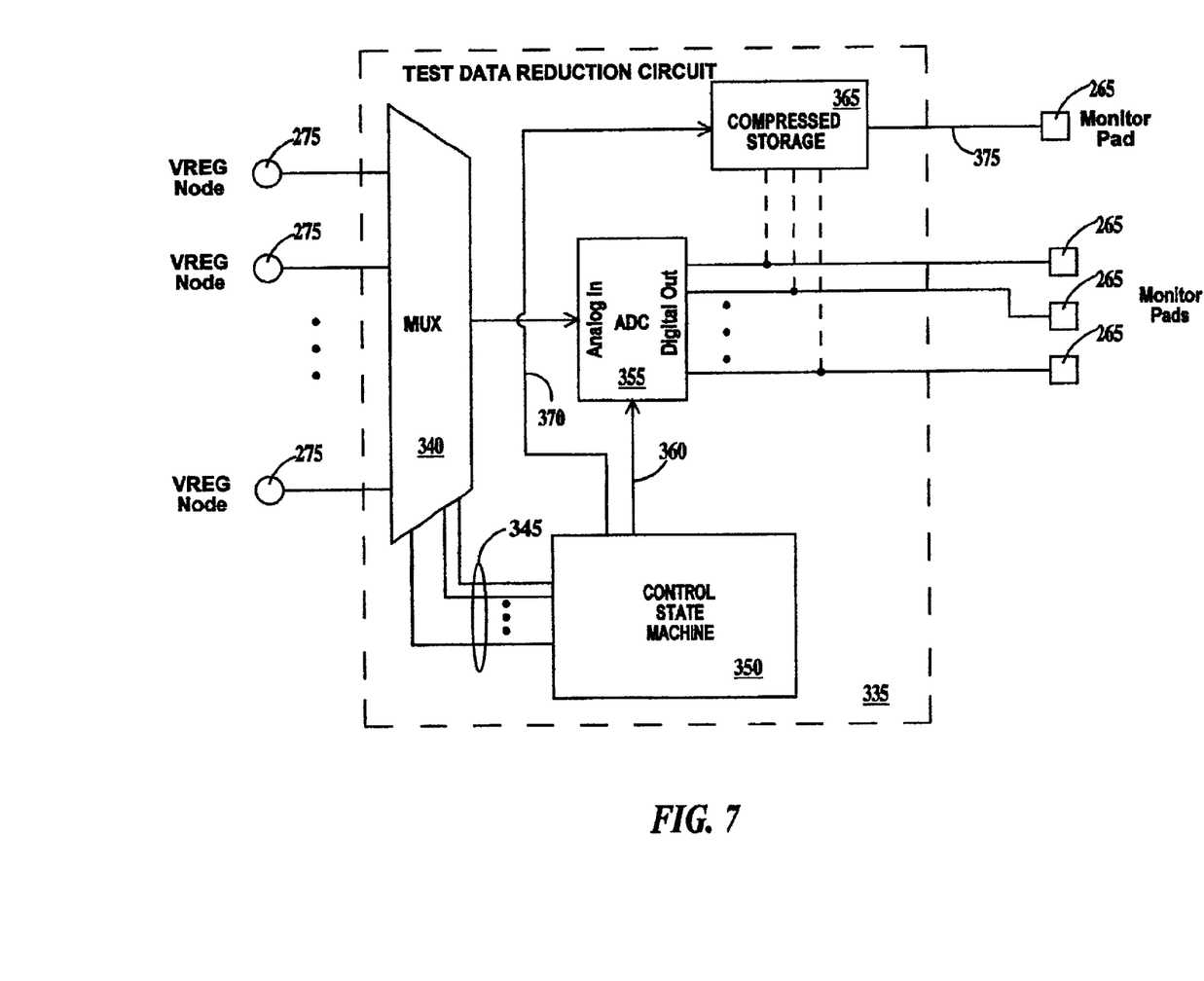
FIG. 7 is a schematic diagram of a second test data output element according to the present invention.

FIG. 2 is a schematic diagram of a second embodiment of the present invention. In FIG. 2, integrated circuit chip 200 includes a regulated power supply 205, a power distribution network circuit 210 and a current sink 115. The purpose of current sink 115 is to emulate current loading on voltage regulator 230 by functional circuits electrically connected to power distribution network 210. Regulated power supply 205 includes a reference generator 220 supplying VREF on a reference voltage line 225 to a multiplicity of voltage regulators 230. Voltage regulators 230 supply the same regulated VREG thru regulated voltage lines 235 to various nodes (see FIG. 3 and description infra) of power distribution network 210. Current sink 115 is electrically connected between a VREG node of power distribution network 210 (see FIG. 3 and description infra) and ground. Reference generator 220 and voltage regulators 230 are all electrically connected between a VCC source 240 and a ground source 245 (which may be a clean ground or the common integrated circuit chip 200 ground), which in one example, are supplied from off-chip. The mode (see supra) of reference generator 220 is controlled by a first control signal 250, the mode of voltage regulators 230 are controlled by a second control signal 255 and current sink 115 is electrically connected or disconnected from between a VREG node of power distribution network 210 and ground (see FIG. 3 and description infra) by a third control signal 260. Third control signal 260 may also be used to vary the amount of current sinking. Current sink 115 is illustrated as a variable current sink, capable of sinking different amounts of current in response to third control signal 260, however a current sink that sinks a fixed amount of current may be used. In a first example, first control signal 250, second control signal 255 and third control signal 260 are supplied from an off-chip tester and the first and second control signals are the same signal. In a second example, first control signal 250, second control signal 255 and third control signal 260 are supplied from a built-in self-test (BIST) circuit and the first and second control signals are the same signal. A multiplicity of monitor pads 265 are electrically tapped into VREG nodes (see FIG. 3 and description infra) of power distribution network 210 in order to monitor the magnitude of the regulated voltage during testing of regulated power supply 205. Alternatively a single monitor pad 265 may be coupled to a test output element as illustrated in FIGS. 6A and 7 and described infra. Physically the taps may be at the output of voltage regulators 230, at VREG nodes (see FIG. 3 and description infra) of power distribution network 210 or a combination of both.

VREF, supplied by reference generator 220, is a very precise voltage in that the reference generator is insensitive to temperature, input voltage fluctuations and semiconductor process variations such as doping levels and linewidth that affect transistor parametrics. Voltage regulator 230 is a unity gain buffer that replicates the voltage value of VREF in VREG. Reference generator 220 generally cannot provide a large amount of current, however voltage regulator 230 can provide a large amount of current. Since all voltage regulators 230 should produce the same voltage, reference generator 220 may be omitted as long as all the voltage regulators share some other common reference voltage source.

In normal operational mode, regulated power supply 205 is on, circuits coupled to power distribution network 210 are in functional mode and current sink 115 is electrically disconnected from between a VREG node (see FIG. 3 and description infra) of power distribution network 210 and ground. In test mode, distribution network 210 is placed in a quiescent state in order to simplify clock and input setup/stimulus and to minimize currents native to the operation of the distribution network, reference generator 220 and reference regulator 230 are turned on, current sink 115 is electrically connected between a VREG node (see FIG. 3 and description infra) of distribution network 210 and ground and the voltages on monitor pads 265 are measured. Control signal 260 may be provided from any number of well-known tester-driven current reference techniques or by tester control of a reference/current digital to analog converter (DAC) system.

Figure 3:
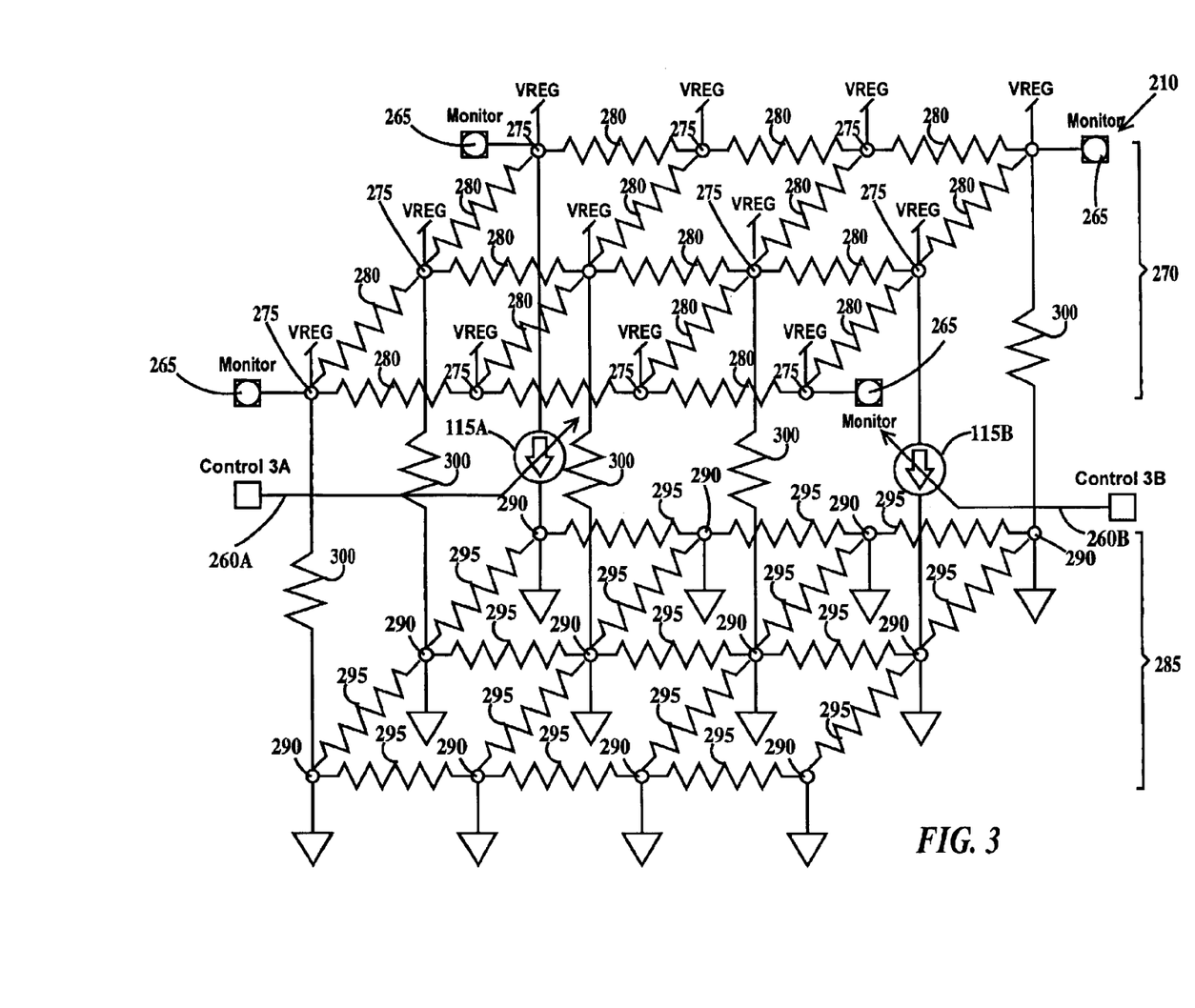
FIG. 3 is a schematic diagram of a power distribution network according to the second embodiment of the present invention.

FIG. 3 is a schematic diagram of power distribution network 210 according to the second embodiment of the present invention. In FIG. 3, a VREG node network 270 comprises a multiplicity of VREG nodes 275 coupled into a grid by wires 280. Wires 280 are shown as resistors, but it should be kept in mind, that wires 280 have capacitive and inductive components as well as a resistive component. A ground node network 285 comprises a multiplicity of ground nodes 290 coupled into a grid by wires 295. Wires 295 are shown as resistors, but it should be kept in mind, that wires 295 have capacitive and inductive components as well as a resistive component. Electrically connected between selected VREG nodes 275 and selected ground nodes 290 are a multiplicity of circuits 300. Circuits 300 are illustrated as resistors to model their average current consumption during functional switching, however, it is understood that circuits have capacitive, inductive as well as resistive components. Although the majority of charge transfer within any circuit is due to the sequential charging and discharging of internal and output capacitances, the average of a circuit''s transfer over time may be represented as a DC resistive load. A multiplicity of monitor pads 265 (which may be internal points in the chip) are coupled to selected VREG nodes 275. Not every VREG node 275 need be coupled to a monitor pad 265. A first current sink 115A controlled by a control signal 260A is coupled between one of VREG node 275 and one of ground nodes 290. A second current sink 115B controlled by a control signal 260B is coupled between one different VREG node 275 and one different ground nodes 290. More or less current sinks 115 may be employed and control signals 260A and 260B may or may not be the same signal.

Figure 4:
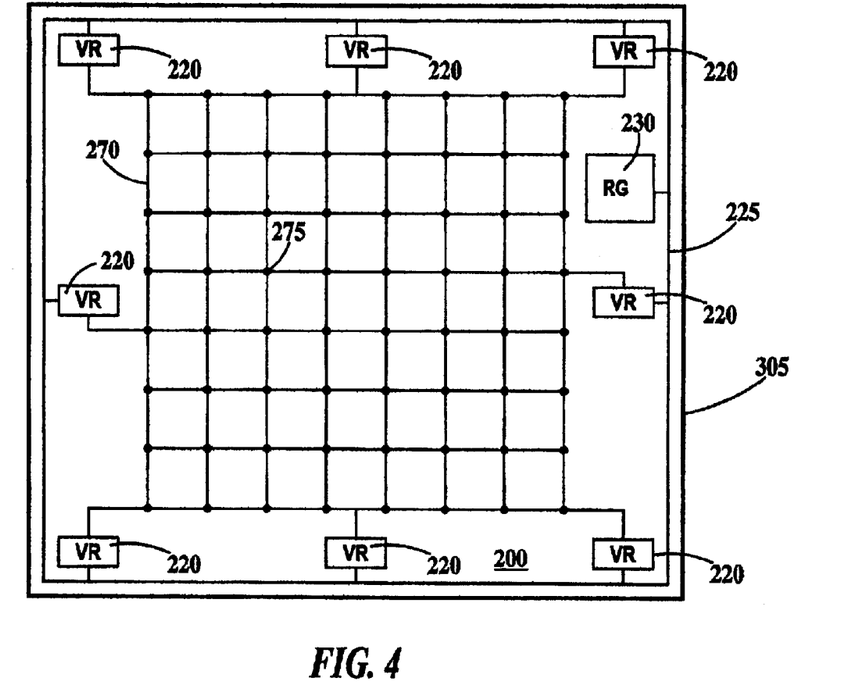
FIG. 4 is an exemplary layout view of an integrated circuit chip according to the second embodiment of the present invention.

FIG. 4 is an exemplary layout view of integrated circuit chip 200 according to the second embodiment of the present invention. In FIG. 4, integrated circuit chip 200, includes a multiplicity of voltage regulators 220 arranged along a perimeter 305 of the chip and a reference generator 230. All voltage regulators 230 are supplied with VREF from a common reference voltage line 225. Each voltage regulator 230 is coupled to a different VREG node 275 on VREG node network 270. The complimentary ground node network (285 in FIG. 3) is not illustrated in FIG. 4.

Figure 5A:
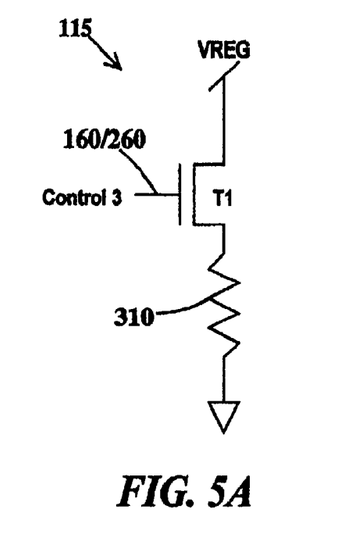
FIG. 5A is a schematic diagram of a first type of current sinking element according to the present invention.

FIG. 5A is a schematic diagram of a first type of current sinking element 115 according to the present invention. In FIG. 5A, control signal 160/260 is applied to the gate of NFET T1, VREG is applied to drain of NFET T1. A fixed resistor 310 sized to carry a specified amount of current at a targeted value of VREF is connected between the source of NFET T1 and ground. When control signal 160/260 is high (test mode), NFET T1 is on and VREG is shorted to ground and current flows through resistor 310. When control signal 160/260 is low (functional mode), NFET T1 is off and no current flows through resistor 310.

Figure 5B:
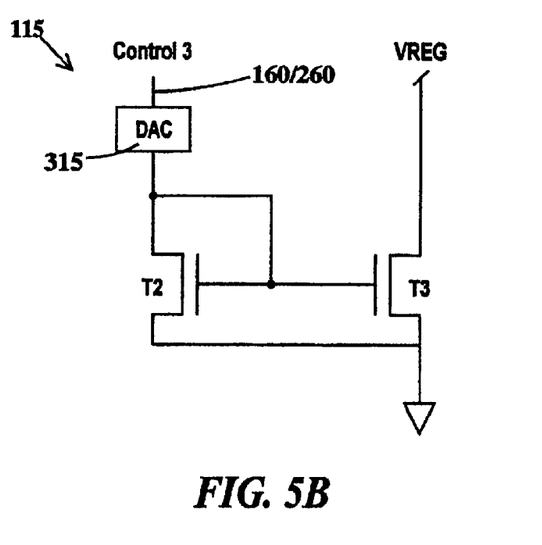
FIG. 5B is a schematic diagram of a second type of current sinking element according to the present invention.

FIG. 5B is a schematic diagram of a second type of current sinking element 115 according to the present invention. The circuit of FIG. 5B is a current mirror. In FIG. 5B, control signal 160/260 (digital in this case) is applied to a DAC 315. The output of DAC 315 is coupled to the gates of NFET T2 and T3 and the drain of NFET T2. VREG is applied to drain of NFET T3. The sources of NFETS T2 and T3 are coupled to ground. NFET T3 is the mirroring element and NFET T2 is the mirrored element of the circuit of FIG. 5B. NFET T3 has a different channel width (W2) than NFET T2 (W1), so NFET T3 will carry more or less current than NFET T2 in proportion to the ratio (W2/W1) with W2 scaled to be in proportion to the desired load current and the number of load mirrors implemented. When control signal 160/260 is set for test mode, NFETs T2 and T3 are on and VREG is shorted to ground and current from the VREG supply flows through resistor NFET T3. When control signal 160/260 is set for functional mode, NFETs T2 and T3 are off and no current flows through NFETs T2 and T3. DAC 315 allows different currents to be selected in test mode based on the bits in control signal 160/260. DAC 315 may be eliminated in favor of a single-value on-chip controllable current source or alternatively, the reference current may be provided for by the tester.

Figure 5C:
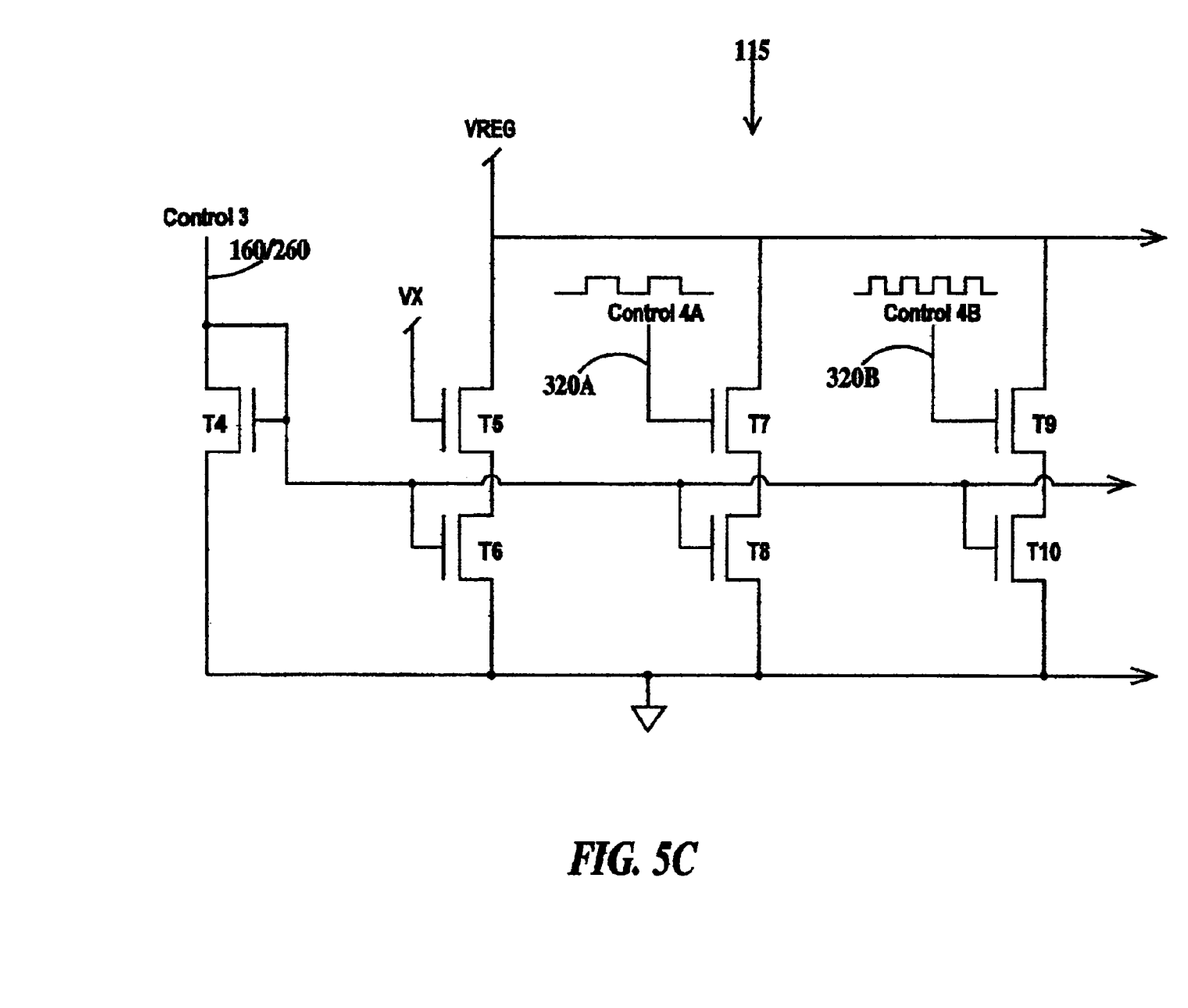
FIG. 5C is a schematic diagram of a third type of current sinking element according to the present invention.

FIG. 5C is a schematic diagram of a third type of current sinking element 115 according to the present invention. The circuit in FIG. 5C is a current mirror with the added capability of sinking current at different voltage on/off patterns or different duty cycles. In FIG. 5C, control signal 160/260 is coupled to the drain of NFET T4 and the gates of NFETs T4, T6, T8 and T10. The sources of NFETs T4, T6, T8 and T10 are coupled to ground. The drain of NFET T6 is coupled to the source of NFET T5, the drain of NFET T8 is coupled to the source of NFET T7 and the drain of NFET T10 is coupled to the source of NFET T9. The drains of NFETS T5, T7 and T9 are coupled to VREF. The gate of NFET T5 is coupled to a voltage source VX that may be turned on or off in test mode and is off in functional mode. The operation of NFETs T4, T6, T8 and T10 in a current mirror is similar to that of the circuit in FIG. 5B described supra. However, NFETs T5, T7 and T9 function as pass gates. When a pulsed control signal 320A is applied to the gate of NFET T7 the current flowing between VREG and ground will vary synchronously with control signal 320A. If VX is high the NFET T7/T8 current variation will be superimposed on top of the NFET T5/T6 current flow. When a pulsed control signal 320B is applied to the gate of NFET T9 the current flowing between VREG and ground will vary synchronously with control signal 320B. If VX is high the NFET T9/T10 current variation will be superimposed on top of the NFET T5/T6 current flow. It is also possible to have all three current flows e.g. NFET T5/T6, NFET T7/T8 and NFET T9/T10 superimposed. Any number of additional current flow NFET transistor pairs may be added to the circuit of FIG. 5C. In addition, NFET T5 may be replaced by a short circuit in applications where NFET T5 will always be on in test mode and the mirror is not sourced in functional mode.

Until this point, we have been concerned with generating a regulated voltage in test mode that is coupled to a monitor point or pad. We will now turn to collecting voltage readings from these monitor points/pads. The circuits illustrated in FIGS. 6A, 6B and 7 are described as applied to the second embodiment of the present invention but are applicable to the first embodiment of the present invention as well, but substituting core VREG input for VREG node.

FIG. 6A is a schematic diagram of a first test data output element according to the present invention. In FIG. 6A, each VREG node 275 is coupled to a first input of a voltage comparitor 325. A second input of each voltage comparitor 325 is coupled to a stable reference voltage VSTAB that generally has the same voltage value as the target VREG. Voltage comparitors 325 produce a logical signal based on whether the measured VREG voltage is greater than, less than or within selected limits of VSTAB. The outputs of all comparitors 325 are coupled to compression logic 330, the output of which is coupled to a monitor pad 265, which reduces I/O pad for test requirements.

Figure 6B:
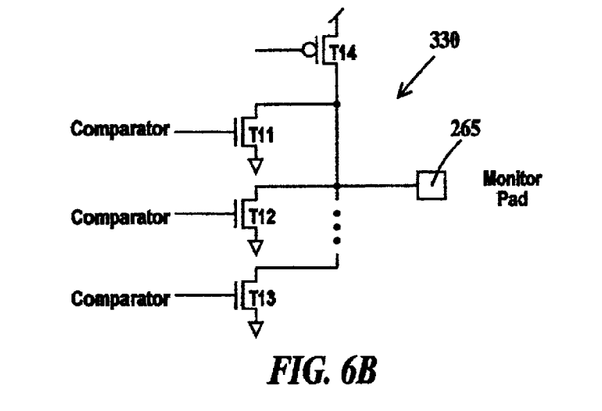
FIG. 6B is a schematic diagram of an exemplary compression logic circuit of FIG. 6A.

FIG. 6B is a schematic diagram of an exemplary compression logic circuit of FIG. 6A. In FIG. 6B compression logic 330 is essentially a NOR gate. In FIG. 6A, NFET T14 is used to precharge monitor output pad 265 high by placing a low on the gate of PFET T14 and then placing a high on the gate. In some applications, PFET T14 may be a weak (small) PFET sized such that when any NFET 11, 12 or 13 turns on, voltage at monitor pad 265 is read as a low value. The gates of NFETs T11, T12 and T13 are coupled to respective voltage comparitor outputs. If any voltage comparitor output is high, then monitor pad 265 is pulled low. If a high on a comparitor output indicates a fail, then a low on monitor pad 265 indicates a fail.

FIG. 7 is a schematic diagram of a second test data output element according to the present invention. In FIG. 7, a test data reduction circuit 335 includes a multiplexer 340 responsive to control signals 345 from a control state machine 350. The inputs of multiplexer 340 are selected VREF nodes 275 and the output of the multiplexer is coupled to the analog input of analog to digital converter (ADC) 355. ADC 355 is responsive to a digital control signal 360 from control state machine 350. The digital output of ADC 355 is a multi-bit word applied across a multiplicity of monitor pads 265. Alternatively, the digital output of ADC 355 is applied to a compressed storage circuit 365 responsive to a control signal 370 from control state machine 350. The output of compressed storage circuit 365 is a high/low signal 375 applied to a single monitor pad 265.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A voltage regulated power supply test circuit, comprising:
    a voltage regulator, supplied by an external power supply and having a voltage regulated output directly connected to at least one regulated voltage node of a functional circuit of an integrated circuit chip; and
    means for selectively and directly connecting at least one current load circuit between one of said at least one regulated voltage node and ground in response to a control signal.

2. The circuit of claim 1, further including a reference voltage generator electrically connected between said voltage regulator and said external power supply.

3. The circuit of claim 1, wherein said current load circuit comprises a gated resistive load.

4. The circuit of claim 1, further including at least one external test pad, each said at least one external test pad electrically connected to one of said at least one regulated voltage node.

5. The circuit of claim 1, wherein said current load circuit comprises a current mirror.

6. The circuit of claim 5, further including means for varying an amount of current flowing through said current load circuit.

7. The circuit of claim 5, wherein said current mirror includes selectable multiple mirror elements each electrically connectable to different voltage sources having different on/off patterns.

8. A circuit for testing a voltage regulated power supply, comprising:
    a voltage regulator electrically connected to at least one regulated voltage node of a functional circuit of an integrated circuit chip;
    means for selectively connecting between one of said at least one regulated voltage node and ground at least one load circuit adapted to put an emulated current load of said functional circuit on said voltage regulated power supply; and
    at least one test point, each said at least one test point electrically connected to one of said at least one regulated voltage node and electrically connected to an I/O monitor pad of said integrated circuit chip.

9. The circuit of claim 8:
    wherein, when there are multiple test points, each test point connected to a different regulated voltage node of said functional circuit; and
    said circuit further including means for combining the voltages on each test point into a signal on said I/O monitor pad.

10. The circuit of claim 9, wherein said means for combining includes:
    a multiplicity of voltage comparators, a first input of each voltage comparator connected to a different test point, a second input of each voltage comparator connected to a reference voltage supply, an output of each said comparator connected to inputs of a compression logic and an output of said compression logic connected to said I/O monitor pad.

11. The circuit of claim 9, wherein said means for combining includes:
    different test point connected to each input of a multiplexer and an output of said multiplexer connected to an analog to digital converter, said multiplexer and said analog to digital converter responsive to control signals from a control state machine, the output of said analog to digital converter connected to at least one or more I/O monitor pads, said at least one or more I/O monitor cads including said I/O monitor pad.

12. The circuit of claim 9, wherein said means for combining includes:
    a different test point connected to each input of a multiplexer and an output of said multiplexer connected to an analog to digital converter, said multiplexer and said analog to digital converter responsive to control signals from a control state machine, the output of said analog to digital converter connected to a compressed storage device, said compressed storage device responsive to said control signals, and said compressed storage device connected said I/O monitor pad.

13. The circuit of claim 8, wherein:
    said at least one regulated voltage node is located on a regulated voltage grid;
    said functional circuit includes component circuits, each component circuit connected between one of said at least one regulated voltage node and at least one ground node on a ground grid having multiple ground nodes; and
    each said at least one load circuit also connected to a single ground node of said at least one ground node.

14. The circuit of claim 13, further including additional voltage regulators, all said voltage regulators located around a periphery of said integrated circuit chip, each voltage regulator connected to a different regulated voltage node of said at least one regulated voltage node.

15. A method of testing a voltage regulated power supply, comprising:
    providing a voltage regulator, supplied by an external power supply and having a voltage regulated output directly connected to at least one regulated voltage node of a functional circuit of an integrated circuit chip; and
    selectively and directly connecting at least one current load circuit between one of said at least one regulated voltage node and ground, said at least one current load circuit adapted to put an emulated current load on said voltage regulated power supply, said emulated current load emulating a current load of said functional circuit on said voltage regulated power supply.

16. The method of claim 15, further including providing a reference voltage generator electrically connected between said voltage regulator and said external power supply.

17. The method of claim 15, wherein said current load circuit comprises a gated resistive load.

18. The method of claim 15, further including providing at least one external test pad, each said at least one external test pad electrically connected to one of said at least one regulated voltage node.

19. The method of claim 15, herein said current load circuit comprises a current mirror.

20. The method of claim 19, further including varying an amount of current flowing through said current load circuit.

21. The method of claim 19, wherein said current mirror includes selectable multiple mirror elements each having different on/off patterns voltage sources and further comprising selectively connecting one or more of said mirror elements to said current load circuit.

22. A method of testing a voltage regulated power supply, comprising:
    providing a voltage regulator electrically connected to at least one regulated voltage node of a functional circuit of an integrated circuit chip;

selectively connecting between one of said at least one regulated voltage nodes and ground at least one load circuit adapted to put an emulated current load of said functional circuit on said voltage regulated supply; and providing at least one test point, each said at least one test point electrically connected to one of said at least one regulated voltage node and electrically connected to an I/O monitor pad of said integrated circuit chip.

23. The method of claim 22:

wherein, when there are multiple test points, connecting each test point to a different regulated voltage node of said functional circuit; and further including combining the voltages on each test point into a signal on said I/O monitor pad.

24. The method of claim 23, wherein the step of combining includes:

providing a multiplicity of voltage comparators, a first input of each voltage comparator connected to a different test point, a second input of said voltage comparator connected to a reference voltage supply, an output of each said comparator connected to inputs of a compression logic and an output of said compression logic.

25. The method of claim 23, wherein the step of combining includes:

providing a different test point connected to each input of a multiplexer and an output of said multiplexer connected to an analog to digital converter, said multiplexer and said analog to digital converter responsive to control signals from a control state machine, the output of said analog to digital converter connected to at least one or more I/O monitor pads, said at least one or more I/O monitor cads including said I/O monitor pad.

26. The method of claim 23, wherein the step of combining includes:

providing a multiplexer, a different test point connected to each input of said multiplexer, an output of said multiplexer connected to an analog to digital converter, said multiplexer and said analog to digital converter responsive to control signals from a control state machine, the output of said analog to digital converter connected to a compressed storage device, said compressed storage device responsive to said control signals, and said compressed storage device connected to said I/O monitor pad.

27. The method of claim 22, wherein;

said at least one regulated voltage node is located on a regulated voltage grid;

said functional circuit includes component circuits, each component circuit connected between one of said at least one regulated voltage node and at least one ground node on a ground grid having multiple ground nodes; and each said at least one load circuit also connected to a single ground node of said at least one around node.

28. The method of claim 27, further including providing additional voltage regulators, all said voltage regulators located around a periphery of said integrated circuit chip, each voltage regulator connected to a different regulated voltage node of said at least one regulated voltage node.

* * * * *

UNITED STATES PATENT AND TRADEMARK OFFICE
CERTIFICATE OF CORRECTION

PATENT NO. : 6,927,590 B2
DATED : August 9, 2005
INVENTOR(S) : Iadanza

It is certified that error appears in the above-identified patent and that said Letters Patent is hereby corrected as shown below:

<u>Column 8,</u>
Line 5, delete "cads" and insert -- pads --.
Line 54, delete "herein" and insert -- wherein --.

<u>Column 10,</u>
Line 25, delete "around" and insert -- ground --.

Signed and Sealed this

First Day of November, 2005

JON W. DUDAS
*Director of the United States Patent and Trademark Office*